United States Patent [19]
McClure

[11] Patent Number: 5,841,789
[45] Date of Patent: Nov. 24, 1998

[54] APPARATUS FOR TESTING SIGNAL TIMING AND PROGRAMMING DELAY

[75] Inventor: David Charles McClure, Carrollton, Tex.

[73] Assignee: STMicroelectronics, Inc., Carrollton, Tex.

[21] Appl. No.: 647,222

[22] Filed: May 9, 1996

Related U.S. Application Data

[62] Division of Ser. No. 189,589, Jan. 31, 1994, Pat. No. 5,579,326.

[51] Int. Cl.⁶ .............................. G01R 31/28; G11C 29/00
[52] U.S. Cl. ......................... 371/22.1; 371/21.1; 327/276
[58] Field of Search ................................. 371/22.1, 22.2, 371/21.1; 365/194, 201; 327/276, 525; 326/16

[56] References Cited

U.S. PATENT DOCUMENTS

5,361,230  11/1994  Ikeda et al. .............................. 365/194

*Primary Examiner*—Hoa T. Nguyen
*Attorney, Agent, or Firm*—Theodore E. Galanthay; Kenneth C. Hill; Lisa K. Jorgensen

[57] ABSTRACT

A method and apparatus for testing and programming signal timing are disclosed which can be incorporated into an integrated circuit device utilizing on-chip timed command signals and pulses. The method of the invention enables nonpermanent testing and retesting of a device at various operational speeds during production testing. During retesting, temporary signal delays are selectively introduced into the circuit of a device which failed a previous test due to non-repairable errors. Once a device passes the production test error-free or with repairable errors, the temporary signal delays are permanently programmed into the device. Specifically, the method utilizes one or a plurality of mode control circuits and test voltage input terminals to nonpermanently select signal delays which may be identified and permanently enabled at a later time.

22 Claims, 4 Drawing Sheets

APPARATUS FOR TESTING SIGNAL TIMING AND PROGRAMMING DELAY

This is a Division, of application Ser. No. 08/189,589, filed Jan. 31, 1994, now U.S. Pat. No. 5,579,326.

CROSS REFERENCE TO RELATED APPLICATIONS

The subject matter of the present application is related to U.S. Pat. No. 5,428,311, entitled "FUSE CIRCUITRY TO CONTROL THE PROPAGATION DELAY OF AN IC," commonly assigned with the Present application to SGS-Thomson Microelectronics Inc. and incorporated herein by reference. The subject matter of the present application is also related to copending Ser. No. 08/801,452, which is a file wrapper continuation of 08/507,023, now abandoned, which is a file wrapper continuation of Ser. No. 08/100,624, now abandoned, entitled "Variable Impedance Delay Elements", filed on Jul. 30, 1993, which is also assigned to SGS-Thomson Microelectronics, Inc., the assignee hereof, and also herein incorporated by reference.

BACKGROUND OF THE INVENTION

1. Field of the Invention

The present invention is in the field of integrated circuits, particularly directed to on-chip timing, and is more specifically directed to programming sense amplifier timing and edge transition detection pulse width during production testing of semiconductor memory arrays.

2. Description of the Prior Art

A primary concern in the construction of semiconductor memories is how to achieve optimum device performance while maximizing yields and minimizing manufacturing costs. Many types of semiconductor memories are containing greater numbers of storage locations, higher capacity, and faster operating speeds as the manufacturing technology improves. For example, static random access memories (SRAMs) having $2^{20}$ storage locations (i.e., 1 Mbits) and dynamic random access memories (DRAMs) having $2^{22}$ storage locations (i.e., 4 Mbits) are available in the market, running at operational speeds in excess of 100 MHz. Additional high-density memories include FIFOs, dual-port memories, and read-only memories of various types, fabricated as individual components and embedded in other integrated circuits such as microprocessors and other logic devices.

These high-density memories, however, are usable only if each and every data storage location or "bit" can be timely accessed and store both digital data states. Failure of a single bit may cause the entire memory device (and logic device having an embedded memory) to be non-marketable, thereby increasing manufacturing costs and decreasing yields.

Although strict controls are exercised during device fabrication, process conditions and the surrounding environment cannot be reproduced without variation. Therefore, the resulting memory devices inevitably have a diversity of performance levels such as differing set-up times, hold times, and operational speeds. As the industry continues to push for larger capacity, faster semiconductor devices, the need for cost efficient testing and repair methods increases to overcome the yield decrease attributable to manufacturing variations.

Present testing and repair methods do not facilitate cost efficient high speed testing of a device and subsequent retesting at a slower operational speed. If a part fails merely because a timed command signal received an address, sent a pulse or latched data before an adequate signal was presented, the part must be scrapped even though it could have passed a subsequent test utilizing a delayed mode. Conventional methods of introducing delays to critical signals include using experimental masks, focused ion beam (FIB) adjustment, or placement of fuses in each delay circuit. These methods, however, are nonadjustable, costly, time consuming and prone to error. Therefore, a tradeoff must be made between faster parts or higher manufacturing yields.

Consider, for example, an SRAM device incorporating a dynamic, clocked "DRAM-style" sense amplifier such as a fast cache SRAM memory device. This style of sense amplifier has multiple advantages over other styles including faster speeds and lower power consumption. However, it cannot "recover" its output if it sensed erroneous data. To "recover" a sense amplifier means to change its output during the same clocking cycle if the initial data sensed was incorrect. Therefore, if the sense amplifier prematurely reads data on an otherwise properly functioning device, the die fails and the part must be discarded.

At the wafer fabrication level, production testing exercises the device's operation including sense amplifier enablement. In an effort to increase production yields and prevent failures attributable to premature sensing, present design guard banding practices include conservatively "clocking" the sense amplifier for a worst case time delay. Such clocking takes into consideration process variations, temperature and voltage ranges, to render maximum device functionality over a broad distribution range. Although delayed clocking of the sense amplifier ensures that an adequate signal has built up on the bit lines before the data is read, such a method has the disadvantage of globally slowing down the operational speed of the potentially faster RAMs in the distribution of devices.

Next, consider the situation which arises during the design and manufacture of a new product still under development. Defects may be present particularly during the early development stages of a fabrication process which randomly render isolated bits slower than the remainder of the bits on the part. For example, a new process may successfully allow fabrication of a faster device where approximately ninety-nine percent of the bits function at the faster operational speed and only one percent operate at a slightly slower rate. Since the industry does not have the means for efficiently retesting slower parts, the entire die must be scrapped if an internal pulse was too short or an on-chip signal operated too quickly.

Thus, present testing methods require a trade off between faster operational speeds and higher manufacturing yields. Aggressive timing allows faster parts but lower yields. Conservative timing improves yields but slows down the fastest possible parts.

Therefore, it would be desirable to have a method and circuit for nonpermanently testing, manipulating, and programming the delay or width of a timed command signal enabling the identification of faster parts while maintaining high manufacturing yields in a production environment.

SUMMARY OF THE INVENTION

According to the present invention, method and apparatus are provided for adjusting on-chip timed pulses enabling the fast, efficient nonpermanent testing and retesting of semiconductor memories at varying operational speeds prior to permanently selecting a programmable delay mode.

It is therefore an object of the present invention to provide a method and circuit for adjusting on-chip timing of clocked or pulsed signals utilizing programmable mode logic for implementation of timing delays.

It is a further object of the invention to provide such a method and circuit for programming selected delay intervals in sense amplifier timing during production testing for various operational speeds of a device.

It is a further object of the invention to provide such a method and circuit for programming sense amplifier timing to function at delayed intervals.

It is a further object of the invention to provide such a method and circuit for programming sense amplifier timing to a specific delay mode after nonpermanent testing of several modes.

The invention may be incorporated into an integrated circuit memory by way of a circuit that controls the timing of a clocked signal such as the sense amplifier clock signal. In a preferred embodiment, a mode control logic circuit is associated with the sense amplifier clocking and delay circuitry. The mode control logic circuit can be used to manipulate sense amplifier signal timing during production testing and to program a delay in the signal once optimum performance speed has been established. In addition, the invention may be incorporated into other locations of an integrated circuit to adjust the timing or lengthen the pulse of various other internally generated critical signals such as edge or address transition detection pulses.

Other objects and advantages of the present invention will be apparent to those of ordinary skill in the art having reference to the following specification together with the drawings.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
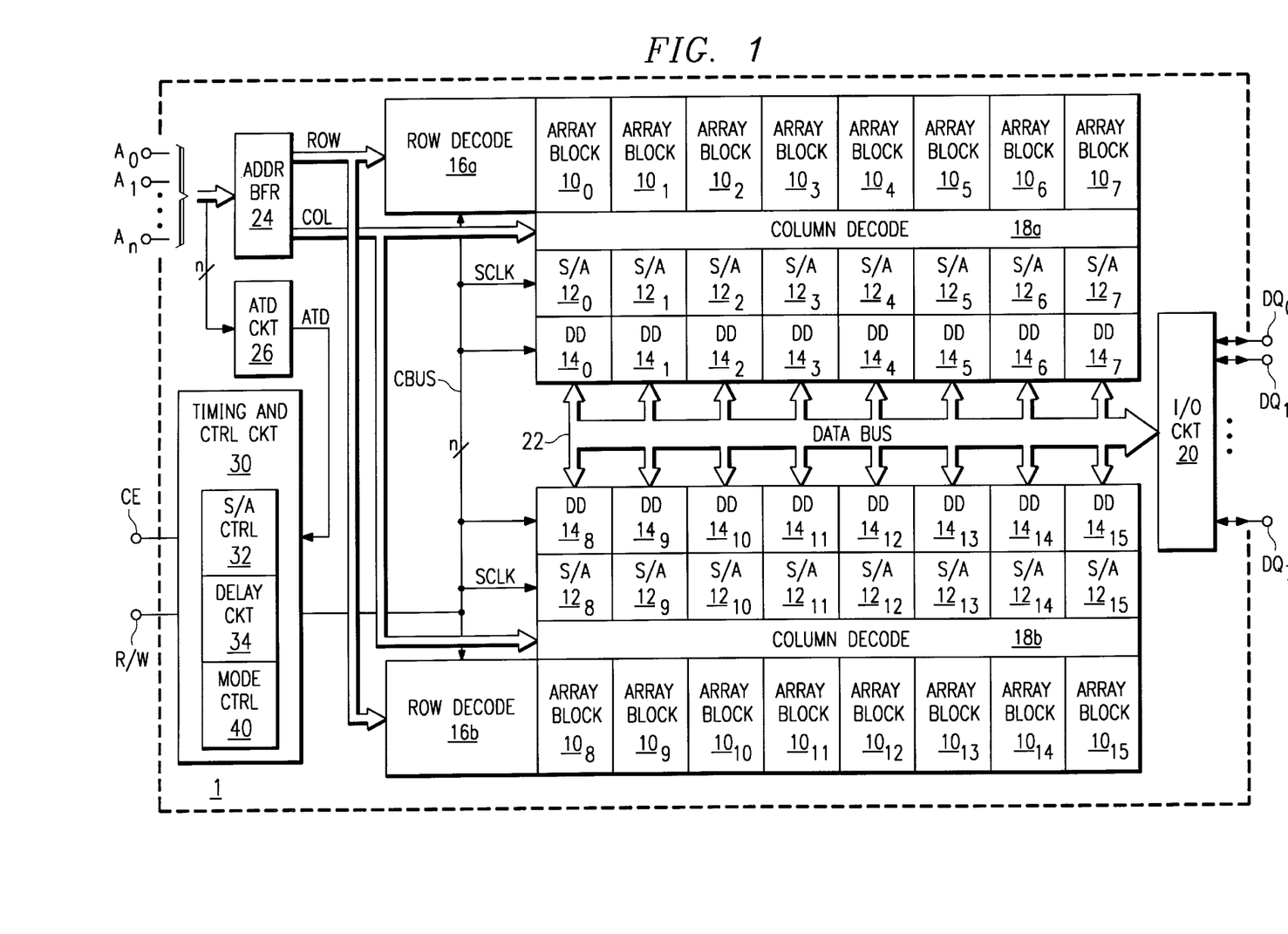
FIG. 1 is an electrical diagram, in block form, of a memory incorporating a preferred embodiment of the invention.

Referring now to FIG. 1, an example of an integrated circuit into which a preferred embodiment of the invention is implemented will be described. In this example, memory 1 is a static random access memory (SRAM) of otherwise conventional architecture, having its memory cells in multiple blocks 10 which are shown according to an example of their physical location in such a memory. It is contemplated that integrated circuits of other types having timed pulses may also benefit from the present invention. Such integrated circuits include, for example, read-only memories, FIFOs, DRAMs and the like, as well as microprocessors and other logic devices with timed pulse circuits.

Memory cells 10 are conventionally arranged in rows and columns. In this example, memory 1 is a 128k-by-8 1 Mbit SRAM, and includes 1024 columns for each of 1024 rows. It should be noted that the memory array configuration of FIG. 1 is chosen by way of example only and that the present invention is applicable to other row-by-column memory organizations. Consistent with the general understanding in the art, the term "row" refers to the array direction in which a plurality of memory cells are selected by way of a word line; in conventional memories, each of the memory cells in the selected row are generally coupled to one or a complementary pair of bit lines. Similarly, the term "column" is used to refer to the array direction in which one or more of the memory cells in the selected row are selected for read or write access; in conventional memories, this is generally accomplished by coupling one of the bit lines to a sense amplifier/write circuit, or to an internal data bus. Voltage signals from the rows and columns (known as data) are commonly input into and read by sense amplifiers which output these signals to conventional data drivers such as latches.

Address terminals $A_o$ through $A_n$ receive an address signal according to which the memory cells to be accessed are designated. In the conventional manner, address terminals $A_o$ through $A_n$ are connected to address buffers 24, which buffer the received address signal and communicate a portion of the address signal to row decoders 16a, 16b on bus ROW, and communicate the remainder to column decoders 18a, 18b on bus COL. Row decoders 16a, 16b select a row of memory cells by enabling the selected word line in the conventional manner, and in this example are located along a side of the memory array blocks 10. Column decoders 18a, 18b, in this example, select eight memory cells in the selected row to be sensed by a sense amplifier 12 according to the column portion of the address.

In memory 1 according to this example, the memory cells are grouped into sixteen array blocks $10_0$ through $10_{15}$. The number of array blocks 10 may vary from implementation to implementation, according to the desired functionality of the device. In this example, the memory array is divided into halves, with array blocks $10_0$ through $10_7$ in one array half and array blocks $10_8$ through $10_{15}$ in the other half. Internal data bus 22 runs the length of the array halves, and is located therebetween as shown in FIG. 1. Data bus 22 includes eight data conductors, each associated with an input/output terminal $DQ_0$ through $DQ_7$ and coupled thereto via input/output circuitry 20. Each individual data conductor is connected to a corresponding data driver 14 in each of the sixteen data driver groups $14_0$ through $14_{15}$ of the sixteen array blocks $10_0$ through $10_{15}$.

Each of array blocks $10_0$ through $10_{15}$ is associated with a corresponding group of sense amplifiers $12_0$ through $12_{15}$, as shown in FIG. 1. In this example, eight individual sense amplifiers 12 are included within each group of sense amplifiers $12_0$ through $12_{15}$, one sense amplifier 12 for each of the eight bits to be communicated on internal data bus 22 from the selected one of primary array blocks $10_0$ through $10_{15}$. Groups of data drivers $14_0$ through $14_{15}$ are each associated with a corresponding group of sense amplifiers $12_0$ through $12_{15}$ for receiving the data signal therefrom and for driving internal data bus 22 therewith; individual data drivers 14 are associated with individual sense amplifiers 12 in each group. one data driver 14 for driving each line in data bus 22.

An example of the configuration and operation of a conventional semiconductor memory as shown in FIG. 1, is described in U.S. Pat. No. 5,262,994, issued Nov. 16, 1993, assigned to SGS-Thomson Microelectronics, Inc., and incorporated herein by this reference. An example of an alternative memory configuration into which the present invention may be incorporated is described in U.S. Pat. No. 5,265,100, issued Nov. 23, 1993, assigned to SGS-Thomson Microelectronics, Inc., and incorporated herein by this reference.

Memory 1, as in the case of most modern SRAMs and DRAMs, includes some amount of dynamic operation, such as precharging and equilibration of certain nodes (e.g., bit lines) at particular points in the memory cycle. Initiation of the cycle in memory 1 occurs by way of address transition detection, performed by address transition detection (ATD) circuit 26. ATD circuit 26 is connected to each of the address inputs $A_o$ through $A_n$ preferably prior to address buffers 24 (as shown), and generates a pulse on line ATD responsive to detecting a transition at any one or more of address inputs $A_o$ through $A_n$, such a pulse useful in controlling the internal operation of memory 1 in the conventional manner. A preferred example of ATD circuit 26 and address buffers 24 is described in U.S. Pat. No. 5,124,584, issued Jun. 23, 1993, assigned to SGS-Thomson Microelectronics, Inc., and incorporated herein by this reference.

Other internal operational functions are controlled by timing and control circuitry 30, which receives the signal on line ATD from ATD circuit 26, and which also receives certain external control signals such as the chip enable signal at terminal CE, and the read/write select signal at terminal R/W. Sense amplifier control circuit 32, programmable delay circuit 34, mode control circuit 40 and the remainder of timing and control circuitry 30 generate various control signals based on these inputs, for control of the various functions within memory 1. These signals include timing the length of edge transition delay pulses and clocking sense amplifiers on a global or individual level. As shown in FIG. 1, control bus CBUS is connected between timing and control circuitry 30, sense amplifiers 12 and data drivers 14. Other functions are similarly controlled by timing circuitry 30 using conventional methods, with their connections not shown in FIG. 1 for purposes of clarity.

It should be noted that timing control circuitry 30 is generally not a particular block of circuitry, as suggested in FIG. 1, but is typically distributed throughout memory 1 to control operation of various portions within. Examples of alternate methods and circuits for sending and controlling input signals throughout a device are described in copending applications U.S. Pat. No. 5,627,793, entitled "CLOCK GENERATION CIRCUIT HAVING COMPENSATION FOR SEMICONDUCTOR MANUFACTURING VARIATIONS", and U.S. Pat. No. 5,485,430, entitled "MULTIPLE CLOCKED DYNAMIC SENSE AMPLIFIER", both of which are assigned to SGS-Thomson Microelectronics, Inc. and incorporated herein by this reference.

Figure 2:
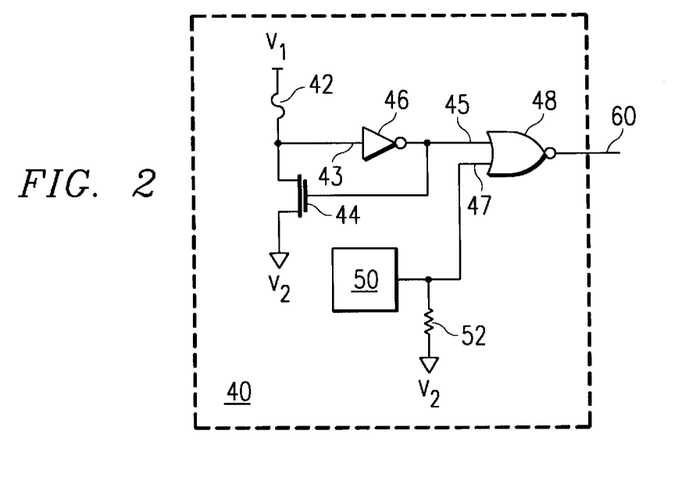
FIG. 2 is an electrical diagram, in schematic form, of a mode control circuit according to a preferred embodiment of the invention.

In a preferred embodiment of the invention, the timing and control signals generated throughout timing and control circuitry 30 and address transition detection circuit 26 can be selectively delayed during production testing. Referring now to FIG. 2, a circuit incorporating a preferred embodiment of the invention will be initially described without reference to, or limitation by, semiconductor memories or related delay circuits.

Mode control circuit 40 as disclosed in FIG. 2 consists of fuse element 42, transistor 44, logic elements 46, 48, test voltage input terminal 50 and pull-down resistor 52, coupled between two voltage sources. Specifically, logic elements 46, 48 can be any one or plurality of logic elements such as inverters, NOR gates or NAND gates. It will be understood by one skilled in the art that different types and numbers of conventional logic elements may be substituted for the logic elements shown in FIG. 2. Such logic elements will be chosen according to the design and performance specifications of the device incorporating the present invention.

As shown in FIG. 2, fuse element 42 has a first terminal connected to a first voltage source V1 and second terminal connected to transistor 44 and input 43 of inverter 46. With fuse element 42 intact, transistor 44 has its source to drain path coupled between the first voltage source V1 and a second voltage source V2. The output of inverter 46 controls the gate of transistor 44 and is connected to input 45 of NOR gate 48. Input 47 of NOR gate 48 is connected to test voltage input terminal 50 and a first terminal of resistor 52. The second terminal of resistor 52 is connected to the second voltage source V2.

Fuse element 42 can be any programmable component or device which, when opened or programmed, breaks the series connection between the first voltage source V1 and transistor 44. In this embodiment, fuse element 42 is preferably a polysilicon fuse. It may also be an antifuse or other similar device. In this example, transistor 44 is an N-channel MOS transistor. It will be understood and appreciated by one skilled in the art that transistor 44 may be a bipolar transistor or any other switching element. In addition, the number of transistors and fuses placed in the series path between voltage sources V1, V2 will be dictated by the specific design and performance characteristics of the device incorporating the present invention. Furthermore, it will be understood that test voltage input terminal 50 can be any type of voltage input terminal such as a test pad at the wafer level or a test pin at the package level.

Operation of mode control circuit 40 can be easily understood with consideration of the following example where first voltage source V1 is high and second voltage source V2 is low, Vcc and Vss respectively. Output signal 60 will be high only if both inputs 45, 47 are maintained at low logic states. With fuse element 42 intact, input 43 of inverter 46 is high, thereby generating a low logic state at input 45 of NOR gate 48. Therefore, output signal 60 is dependent upon the value of the voltage sent through test pad 50. When test pad 50 is driven low, input 47 is pulled to a low logic state and output signal 60 is maintained at a high logic state. Applying a high voltage source to test pad 50 during the testing stage, however, pulls input 47 to a high logic state, thereby maintaining output signal 60 at a low logic level.

In this example, if the designer desires to place output signal 60 in a high logic state, fuse element 42 remains intact, maintaining inputs 45, 47 at low logic states, based on test pad 50 being low. If testing reveals that the desired device performance is achieved when output signal 60 is maintained at a low logic state, fuse element 42 is opened. When fuse 42 is opened, transistor 44 pulls input 43 low, towards V2 and maintains input 45 at a high logic state, resulting in a low logic state at output 60.

Placement of one or a plurality of mode control circuits 40 into a device can facilitate cost efficient testing and retesting of devices by allowing the operator to quickly and nonpermanently manipulate programmable delay circuitry 34 during production testing. Conventional methods of introducing delays to critical signals typically requires the use of experimental masks or focused ion beam (FIB) adjustment which effect the entire die, even though some die do not require the additional delay. Furthermore, FIB is merely a diagnostic tool which still requires generation of an updated mask. Each of the foregoing methods requires that a permanent adjustment to the circuit be made before operation of the device is tested to see if said modification produces an error free part or part with repairable errors. If the changes implemented by the masks or FIBs do not produce a fully functioning part, the part must be scrapped and additional masks generated.

Unlike conventional methods, the present invention allows the designer to isolate and personalize the timing changes on an individual device by device basis. With the use of mode control circuit 40, output 60 can be connected to programmable delay circuit 34 to control selective enabling and programming of various delay modes within a device. Utilizing the principles of the invention, differing delay states of a device can be nonpermanently tested before programming any necessary timing changes into the circuit. Once the desired states are identified, fuse element 42 may be opened or left intact to select the appropriate mode.

Figure 3:
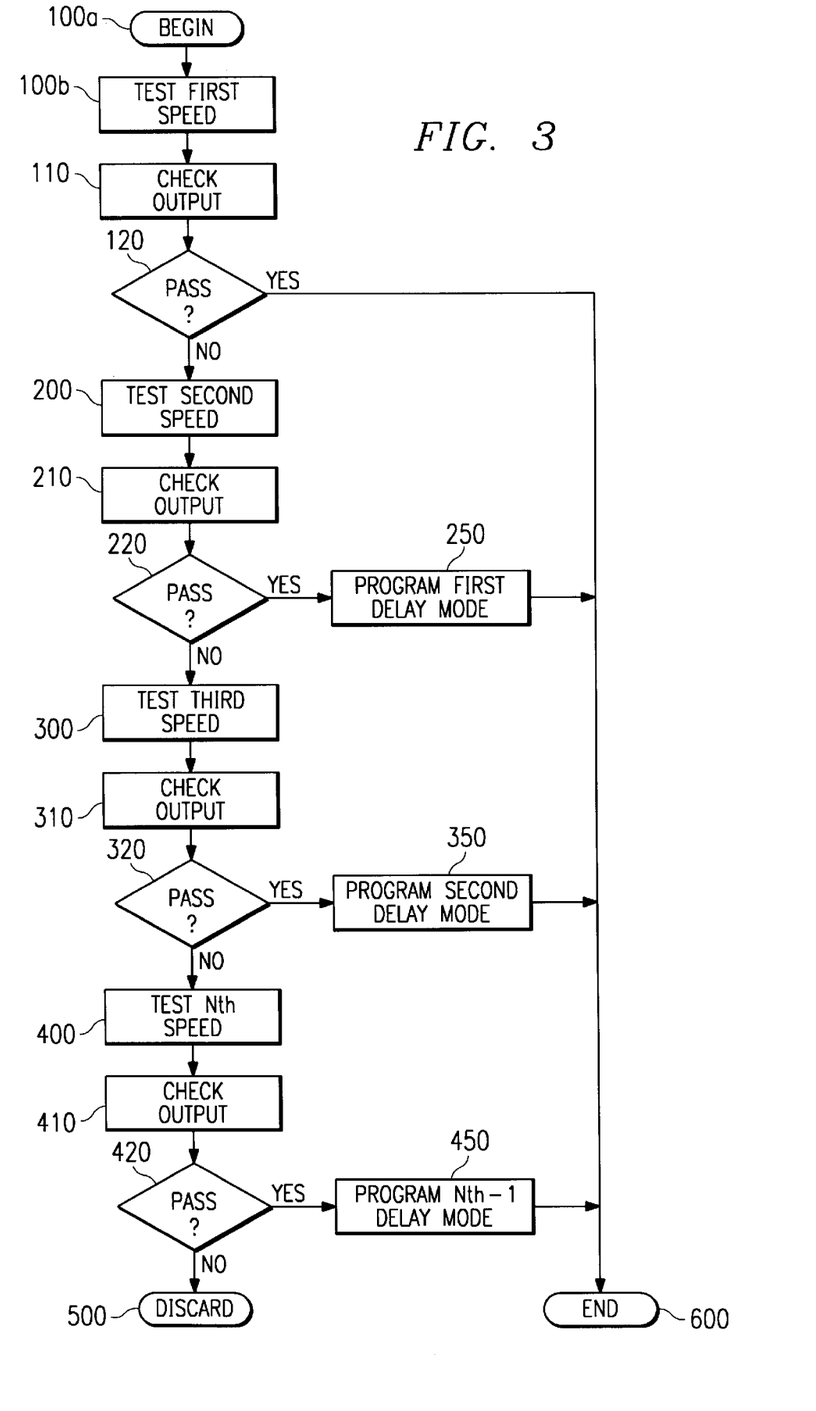
FIG. 3 is a flow chart of the method according to a preferred embodiment of the invention.

Referring now to FIG. 3, a method of testing and retesting a device at varying operational speeds according to a preferred embodiment of the invention will now be described. Such a device would include one or more mode control circuits strategically placed throughout the device with outputs 60 connected to delay circuits 34. In step 100, the initial test for the first operational speed of the device is initiated using conventional testing methods before laser repair (i.e. where the device is enabled and the memory system matrix is scanned for errors). Such conventional methods are modified, however, to include the placement of test probes over test pads 50 with signals in the opposite state than the state needed to activate the delay mode. Proceeding to step 110, the test output is checked for matrix errors and the number and locations of failing bits is recorded. If the device has no errors or the errors are repairable with conventional methods (i.e. with existing redundancy schemes), the device "passed" the test, step 120, is forwarded to laser repair for further conventional processing and testing is terminated, step 600. If the output check of step 110 identifies non-repairable errors in the device, however, it "failed" the initial test, and the method proceeds with step 200.

During testing step 200, the signals through one or more of the test probes to test pads 50 are modified to enable the first delay mode during production testing of the second operational speed. If the output read in step 210 shows the device is repairable under the subsequent speed conditions, the method proceeds to step 250 where the delay mode is either programmed or identified for later programming at laser repair, and testing ends, 600.

If non-repairable errors are identified, however, testing proceed with the third operational speed, step 300. Again, the test probes are adjusted to enable mode circuit 34 controlling the second delay mode, the output is checked at step 310, and if the device has passed 320, the second delay mode is either identified or programmed in step 350 before testing terminates 600. The number of times the test repeats itself will be dictated by the design parameters of the circuit taking the device through N speed tests, step 400 and identifying N−1 delay modes, step 450 before the device is finally scrapped or discarded, step 500. Factors such as testing time and cost will be weighted against performance results sought to dictate the number of testing cycles initiated.

Figure 4:
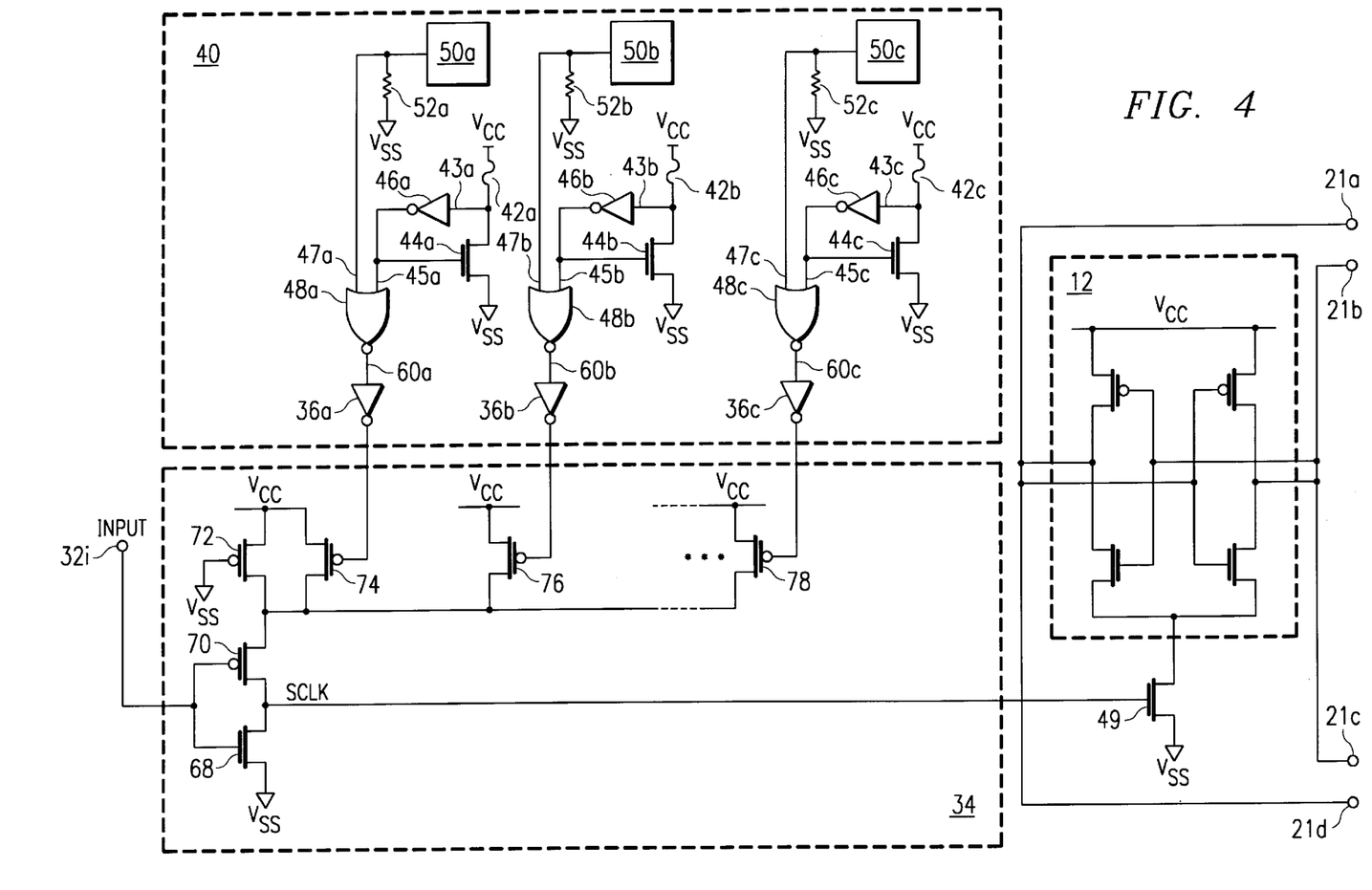
FIG. 4 is an electrical diagram, in schematic form, of a sense amplifier circuit in the architecture of FIG. 1 incorporating a preferred embodiment of the invention.

Although the present invention may utilizes any conventional programmable timing and control circuitry, the method of the invention may be best understood with its application to a specific control signal within a semiconductor device. Referring now to FIG. 4, consider a semiconductor memory device incorporating a dynamic DRAM style sense amplifier in the architecture of FIG. 1. The use of a dynamic DRAM style sense amplifier in FIG. 4 is by way of example only, not limitation. It should be noted that, for purposes of this invention, other sense amplifier arrangements may be used in place of that shown in FIG. 4, including cross-coupled latches, multiplexing, current-mirror, and differential amplifiers. The sense amplifier shown in the circuit of FIG. 4 is provided herein by way of example only.

In a preferred embodiment of the invention, programmable delay circuit 34 utilizes variable impedance delay elements such as those defined in copending application Ser. No. 08/100,624, entitled "Variable Impedance Delay Elements", filed on Jul. 30, 1993, assigned to the assignee hereof, and herein incorporated by reference. Delay circuit 34 can also be any other conventional programmable delay circuit adapted to receive a selective control signal from a mode control circuit such as output signal 60 of mode control circuit 40 shown in FIG. 2. Particular examples of circuitry 34 useful in other embodiments of the inventionl are described in U.S. Pat. No. 5,428,311, entitled "FUSE CIRCUITRY TO CONTROL THE PROPAGATION DELAY OF AN IC", assigned to the assignee hereof, and herein incorporated by reference.

As configured in FIGS. 1 and 4, sense amplifier 12 is connected between memory 10, data driver 14 and delay circuit 34 of timing and control circuitry 30. Specifically, sense amplifier control circuit 32 generates an input signal 32*i* to programmable delay circuit 34. Delay circuit 34 thereupon generates an output signal SCLK which is communicated to sense amplifier 12 via signal line SCLK to sense amplifier control transistor 49. Output signal SCLK controls transistor 49 and enables sense amplifier 12, whereupon sense amplifier 12 reads the data from array block 10 via sense signal lines 21*a, b* and outputs it to data drivers 14 via sense signal lines 21*c, d*. The actual timing delay in generation of signal SCLK to sense amplifier 12 is programmed into delay circuit 34 via mode control circuit 40.

Referring now to FIGS. 3 and 4, the operation of mode control logic 40 during production testing and its communication with delay circuitry 34 and sense amplifier 12 will be described in further detail. The three placements of mode control circuit 40 connect outputs 60 to delay circuitry 34 via inverters 36. As will be understood and appreciated by one skilled in the art, 0 alternative placements of these circuits and embodiments of the invention will become apparent based on the design parameters of the device. For example, there can be one placement of mode control circuit 40 for multiple sense amplifiers 12 and programmable delay circuits 34, or there can be a singular placement of circuits 34, 40 for connection to all sense amplifiers on a global level.

In this example of production testing, the sense amplifiers will not be conservatively "clocked" for a worst case time delay, as is the practice in conventional testing methods. Instead, the sense amplifier will be aggressively clocked, to facilitate identification of the RAMS with the fastest operational speeds. Consider for purposes of this example only that the fastest speed grade is a device operating at 10 ns access times with the most aggressive sense amplifier clocking speed. At testing step 100, three test probes (not shown) are placed on test pads 50 and transmit a low signal state so that the delay modes are not activated. As previously discussed, with fuses 42 intact, this causes outputs 60 to be in a high logic state, which is then inverted to a low logic state via inverters 36 so that transistors 74, 76 and 78 remain on for a minimal SCLK delay. If the output check of step 110 reveals no errors or repairable errors, the device passes at step 120 with the most aggressively clocked sense amplifier, and testing is terminated, step 600.

If non-repairable errors are identified during output check 110, the device fails step 120 and proceeds to step 200. In this example, test cycle 200 is initiated for a different operational speed such as 12 ns access time. The clocking of the sense amplifier is adjusted to this slower, more conservative clocking by changing the test probe signal to force test pad 50a high, thereby turning off transistor 74, activating the first delay mode, and hence, increasing SCLK delay. Proceeding to step 210, the matrix is scanned for errors. If the output reveals no errors or repairable errors the devices passes step 220 and the method proceeds with step 250. During step 250, the first delay mode is programmed by opening fuse 42a or identified for later programming at laser repair and the test terminates, step 600.

If non-repairable errors are identified, the method of the invention is repeated at step 300 for a third operational speed with the second delay mode activated by a high signal through test pad 50b and turn off transistor 76. Output check 310, pass step 320 and programming step 350 are repeated as before. If the device fails at step 320, the process testing process may terminated and the device discarded, step 500 or continued through subsequent delay modes. These delay modes may include singularly applying a high signal to test pad 50c or applying a combination of high and low signals to test pads 50a, 50b and 50c.

This testing method can also be used to test and program conservatively clocked devices for faster speeds, where marketing considerations require identification of fewer fast devices. For example, inverter 36 may be omitted from the circuit and the transistors 74, 76, 78 sizes selected such that application of a low signal to the test pads 50 turns off transistors 74, 76, 78 for maximum delay. Therefore, opening of selected fuse elements 42 speeds the device up. In this alternative embodiment, the design of mode control circuit 40 and programmable delay circuit 34 is such that the initial test speed of step 100 is the slowest operational speed and enablement of the selected modes actually lowers the resistance to Vcc of SCLK when transistor 70 conducts and increases internal signal speeds.

Figure 5:
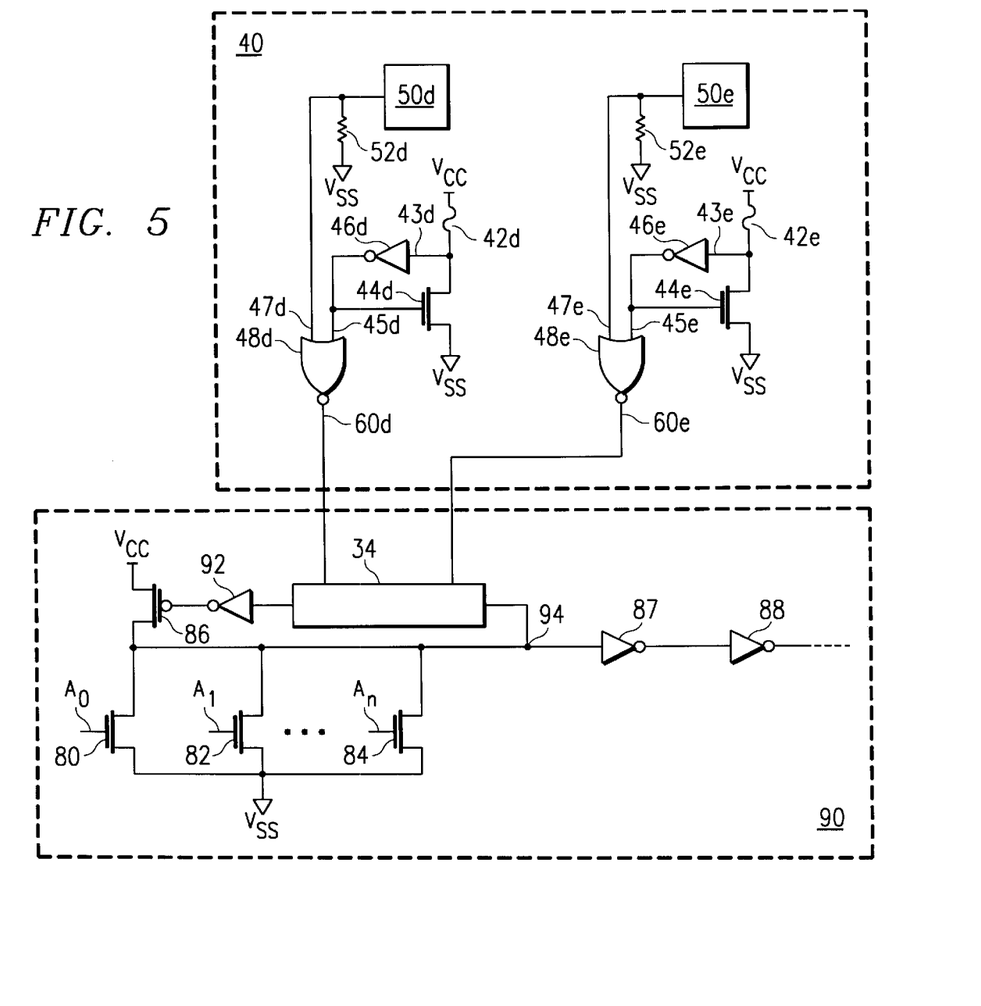
FIG. 5 is an electrical diagram, in schematic form, of an edge transition detection circuit in the architecture of FIG. 1 incorporating a preferred embodiment of the invention.

The present invention may also be used in alternative embodiments to test other delayed control signals and pulse widths within a device prior to programming the delayed signal. Referring to FIG. 5, edge transition detection circuitry 90 includes a conventional programmable delay circuit 34 such as that disclosed in FIG. 4.

In ETD circuit 90, a plurality of N-channel transistors 80, 82, 84 are connected in parallel to one another and are coupled between the second voltage source, Vss and node 94 forming a wired-NOR arrangement to sum incoming ETD pulses from each address or control buffer. Additional N-channel transistors may be placed in parallel with transistors 80, 82, 84 as needed. The ETD circuit is shown by way of example only, and includes control transistor 86, and inverters 87, 88 and 92. Details of normal operation of this circuit are found in copending application Ser. No. 100,624, filed Jun. 30, 1993, assigned to SGS-Thomson Microelectronics, Inc., the assignee hereof and is herein incorporated by reference.

During production testing, the delay time in the signal to the gate of transistor 86 is determined by the application of selected voltages to test pads 50d, 50e. Using the preferred embodiment of the invention, placement of test probes on test pads 50d, 50e will initially pull the signals to the state which does not activate the delay modes in circuitry 34. If non-repairable errors are identified, longer pulse widths are generated by activating the appropriate portions of delay circuitry 34 via changing the signals through test pads 50d, 50e. Upon identification of the desired delay modes, the testing is terminated and the delay modes are programmed or identified for later programming at laser repair.

As disclosed herein, the preferred embodiment of the invention permits adjustment of timing during production testing to tailor timing on a personalized, device by device basis, as opposed to globally affecting the timing of all devices, thereby resulting in higher yields and improved speed distributions. While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A system for testing and programming signal timing in a device, comprising:
   a programmable delay circuit;
   a mode control circuit means for generating a mode enable signal responsive to receipt of a test voltage, said mode enable signal controlling said programmable delay circuit; and
   an edge transition detection circuit, wherein said programmable delay circuit controls said edge transition detection circuit.

2. The system of claim 1 further comprising a sense amplifier circuit, wherein said programmable delay circuit controls said sense amplifier circuit.

3. The system of claim 1, wherein said programmable delay circuit comprises variable impedance delay elements.

4. The system of claim 1, wherein said mode control circuit means comprises:
   a logic element having a first input, a second input and an output;
   a fuse circuit having an output connected to the first input of said logic element; and
   a voltage input terminal connected to the second input of said logic element wherein the test voltage is received at the voltage input terminal.

5. The system of claim 4 wherein said voltage input terminal is a test pad.

6. The system of claim 4, wherein said logic element is a logic gate.

7. The system of claim 6, wherein said logic gate is a NOR gate.

8. A circuit for nonpermanently testing and enabling delay modes in programmable delay circuitry, comprising:
   a first logic element having an input and an output;
   a fuse element having a first terminal and a second terminal wherein the first terminal is coupled to a first voltage source and the second terminal is coupled to the input of said first logic element;
   a transistor having a conduction path coupled between the input of said first logic element and a second voltage source, and having a control electrode connected to the output of said first logic element;

a voltage input terminal; and a second logic element having a first input, a second input and an output, wherein the first input is connected to the output of said first logic element, and the second input is connected to said voltage input terminal.

9. The circuit of claim 8, further comprising a pull-down resistor coupled between the second input of said second logic element and said second voltage source.

10. The circuit of claim 8, wherein said transistor is an n-channel MOS transistor.

11. The circuit of claim 8 wherein said first and second logic elements are logic gates.

12. The circuit of claim 11 wherein said first logic element is an inverter and said second logic element is a NOR gate.

13. The circuit of claim 8, further comprising a programmable delay circuit having variable impediance delay elements connected to said output of said second logic element.

14. The circuit of claim 13, wherein said programmable delay circuit controls a sense amplifier circuit.

15. The circuit of claim 13, wherein said programmable delay circuit controls an edge transition detection circuit.

16. A system for testing and programming signal timing in a device, comprising:

a programmable delay circuit having a plurality of inputs; and a plurality of mode control circuits, each mode control circuit within the plurality of mode control circuits having an input and an output, the output being connected to an input within the plurality of inputs, wherein a test voltage is received at the input and a mode enable signal is generated at the output in response to a receipt of the test voltage and wherein the mode enable signal controls the programmable delay circuit, wherein each mode control circuit includes:

a logic element having a first input, a second input for receiving the test voltage, and an output forming the output of the mode control circuit; and a fuse element having an output connected to the first input of the logic element;

wherein blowing the fuse element in one of the plurality of mode control circuits alters a delay generated by the programmable delay circuit.

17. The system of claim 16, wherein the fuse element is a polysilicon fuse.

18. The system of claim 16, wherein each mode control circuit includes:

a first logic element having an input and an output;

a fuse element having a first terminal and a second terminal, wherein the first terminal is connected to a first voltage source and the second terminal is connected to the input of the first logic element;

a transistor having a conduction path coupled between the input of the first logic element and a second voltage source, and having a control electrode connected to the output of the first logic element;

a voltage input terminal; and a second logic element having a first input, a second input, and an output, wherein the first input is connected to the output of the first logic element, and the second input is connected to the voltage input terminal.

19. The system of claim 18 further comprising a pull-down resistor coupled between the second input of the second logic element and the second voltage source.

20. The system of claim 19, wherein the transistor is an n-channel metal oxide semiconductor transistor.

21. The system of claim 18, wherein the first logic element and the second logic elements are logic gates.

22. The system of claim 21, wherein the first logic element is an invertor and the second logic element is a NOR gate.

* * * * *